United States Patent
Shim et al.

(10) Patent No.: US 8,319,340 B2
(45) Date of Patent: Nov. 27, 2012

(54) LEAD FRAME AND METHOD OF MANUFACTURING THE SAME

(75) Inventors: Chang-han Shim, Changwon (KR); Sung-kwan Paek, Changwon (KR)

(73) Assignee: Samsung Techwin Co., Ltd., Changwon (KR)

(*) Notice: Subject to any disclaimer, the term of this patent is extended or adjusted under 35 U.S.C. 154(b) by 119 days.

(21) Appl. No.: 12/883,481

(22) Filed: Sep. 16, 2010

(65) Prior Publication Data

US 2011/0079887 A1    Apr. 7, 2011

(30) Foreign Application Priority Data

Oct. 1, 2009   (KR) .................. 10-2009-0094051

(51) Int. Cl.
- *H01L 23/48* (2006.01)
- *H01L 23/52* (2006.01)
- *H01L 29/40* (2006.01)

(52) U.S. Cl. ...................... 257/739; 438/123

(58) Field of Classification Search ........... 257/666, 257/677, 739; 438/111, 123
See application file for complete search history.

(56) References Cited

U.S. PATENT DOCUMENTS

| | | | |
|---|---|---|---|
| 2002/0153596 A1* | 10/2002 | Tsubosaki et al. | 257/666 |
| 2004/0232534 A1* | 11/2004 | Seki et al. | 257/678 |
| 2012/0001307 A1* | 1/2012 | Cho et al. | 257/666 |

FOREIGN PATENT DOCUMENTS

| | | |
|---|---|---|
| JP | 6-29439 A | 2/1994 |
| JP | 9-283688 A | 10/1997 |
| JP | 2001-127229 A | 5/2001 |
| JP | 2005-213573 A | 8/2005 |
| KR | 10-2007-0119758 A | 12/2007 |
| WO | 2006/115267 A1 | 11/2006 |

OTHER PUBLICATIONS

Communication dated Jul. 1, 2011 issued by the Korean Intellectual Property Office in counterpart Korean Appl. No. 10-2009-0094051.
Korean Office Action issued on Feb. 14, 2011 in the corresponding Korean Patent Application No. 10-2009-0094051.

* cited by examiner

*Primary Examiner* — S. V Clark
(74) *Attorney, Agent, or Firm* — Sughrue Mion, PLLC

(57) ABSTRACT

A lead frame having improved connectivity with a molded portion and a method of manufacturing the lead frame are provided. The lead frame includes a die pad on which a semiconductor chip is to be disposed; at least one lead portion arranged to be connected to the semiconductor chip; and at least one plating layer formed on at least one of the at least one lead portion and the die pad, wherein a top surface of the at least one plating layer has an uneven portion having a first average surface roughness.

26 Claims, 4 Drawing Sheets

LEAD FRAME AND METHOD OF MANUFACTURING THE SAME

CROSS-REFERENCE TO RELATED PATENT APPLICATION

This application claims priority from Korean Patent Application No. 10-2009-0094051, filed on Oct. 1, 2009, the disclosure of which is incorporated herein in its entirety by reference.

BACKGROUND

1. Field

Apparatuses and methods consistent with the present inventive concept relate to a lead frame and a method of manufacturing the same, and more particularly, to a lead frame having improved connectivity with a molded portion and a method of manufacturing the lead frame.

2. Description of the Related Art

A lead frame forms a semiconductor package together with a semiconductor chip, supports the semiconductor chip, and electrically connects the semiconductor chip to an external circuit (e.g., a printed circuit board (PCB)).

Specifically, a semiconductor chip is installed on a die pad of a lead frame by using an adhesive, for example. Then, the semiconductor chip is connected to a lead of the lead frame via a bonding wire. The semiconductor chip and bonded portion between the semiconductor chip and the lead are sealed by a molded portion including a resin for insulation and protection against external factors.

However, gaps are formed between the molded portion and the lead frame due to low connectivity between the molded portion and the lead frame, and thus durability of a semiconductor package decreases.

Especially, when a semiconductor package is exposed to a high temperature environment, moisture in a molded part expands, and delamination occurs between the molded portion and the lead frame that are tightly contacting each other, and thus, structural and functional reliabilities of the semiconductor package are deteriorated.

SUMMARY

One or more exemplary embodiments of the present inventive concept provide a lead frame having improved connectivity with a molded portion, and a method of manufacturing the lead frame.

According to an exemplary embodiment, there is provided a lead frame including a die pad on which a semiconductor chip is to be disposed; at least one lead portion arranged to be connected to the semiconductor chip; and at least one plating layer formed on at least one of the at least one lead portion and the die pad, wherein a top surface of the at least one plating layer comprises an uneven portion having a first average surface roughness.

The at least one plating layer may contain Cu, and may include a copper (Cu) plating layer containing Cu and a protective plating layer formed on the Cu plating layer, wherein the top surface of the at least one plating layer is a top surface of the protective plating layer.

The protective plating layer may include at least one of a nickel (Ni) plating layer containing Ni or a Ni alloy, a palladium (Pd) plating layer which is formed on the Ni plating layer and contains Pd or a Pd alloy, and a gold (Au) plating layer which is formed on the Pd plating layer and contains Au or an Au alloy.

The thickness of the protective plating layer may be greater than that of the Cu plating layer.

The die pad and the lead portions may be integrated as a single body

The thickness of the protective plating layer may be between about 0.125 μm and about 1.0 μm.

The average surface roughness (Ra) of the protective plating layer may be between about 0.1 μm and about 0.5 μm.

The lead frame may further include another plating layer selected from the group consisting of a silver (Ag) plating layer, a gold (Au) plating layer, and a plating layer having a stacked structure of nickel (Ni)/palladium (Pd)/gold (Au), disposed on the protective plating layer.

The protective plating layer may comprise a stacked layer of Ni/Pd/Au.

According to another exemplary embodiment, there is provided a method of manufacturing a lead frame, the method including forming a die pad and at least one lead portion by patterning a raw material substrate; and forming at least one plating layer on at least one of the at least one lead portion and the die pad so that a top surface of the at least one plating layer comprises an uneven portion having a first average surface roughness. The forming the at least one plating layer may include forming a Cu plating layer containing Cu on the at least one of the at least one lead portion and the die pad; and forming a protective plating layer on the Cu plating layer, wherein the top surface of the at least one plating layer is a top surface of the protective plating layer.

The Cu plating layer may be formed in copper sulphate solution by using an electroplating operation.

The copper sulphate solution may contain sulphuric acid and copper sulphate 5 hydrate ($CuSO_4.5H_2O$).

The concentration of the sulphuric acid in the copper sulphate solution may be between about 20 ml/l and about 60 ml/l The concentration of the $CuSO_4.5H_2O$ in the copper sulphate solution may be between about 10 g/l and about 30 g/l.

The rough Cu plating layer may be formed by applying electric current for between about 5 seconds and about 20 seconds.

The protective plating layer may contain Cu.

The protective plating layer may include at least one of a nickel (Ni) plating layer containing Ni or a Ni alloy, a Pd plating layer which is formed on the Ni plating layer and contains Pd or a Pd alloy, and an Au plating layer which is formed on the Pd plating layer and contains Au or an Au alloy.

The thickness of the protective plating layer may be greater than the thickness of the Cu plating layer.

The thickness of the protective plating layer may be between about 0.125 μm and about 1.0 μm.

The average surface roughness of the protective plating layer may be between about 0.1 μm and about 0.5 μm.

The method may further include forming another plating layer selected from the group consisting of an Ag plating layer, an Au plating layer, and a plating layer having a stacked structure of Ni/Pd/Au, disposed on the protective plating layer.

The protective plate layer may comprise a stacked layer of Ni/Pd/Au.

BRIEF DESCRIPTION OF THE DRAWINGS

The above and other aspects of the present invention will become more apparent by describing in detail exemplary embodiments thereof with reference to the attached drawings, in which.

DETAILED DESCRIPTION OF EXEMPLARY EMBODIMENTS

Figure 1:
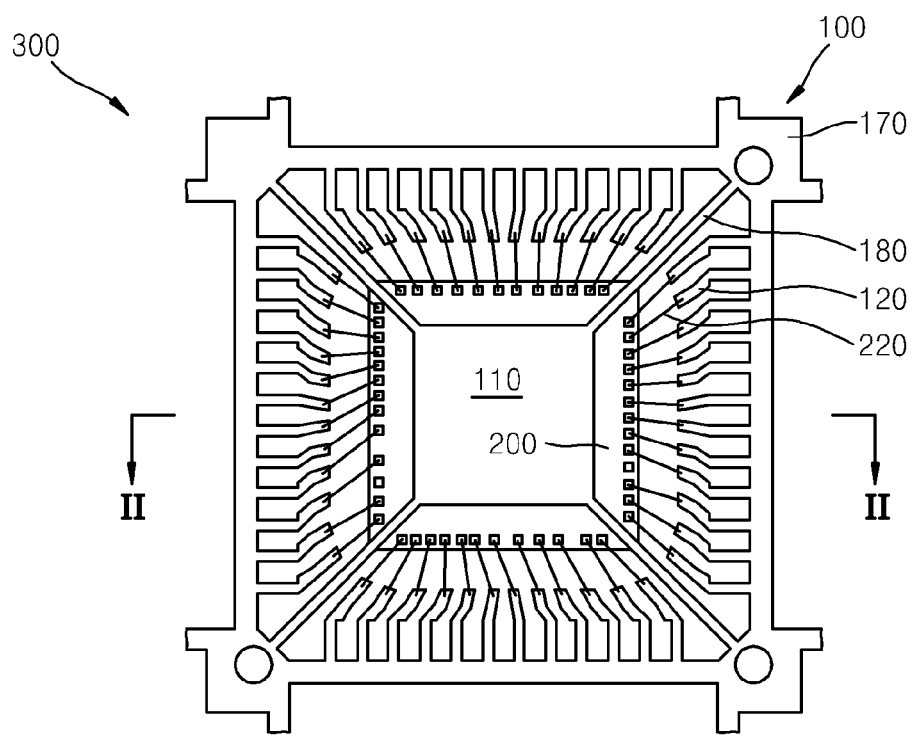
FIG. 1 is a plan view of a lead frame according to an exemplary embodiment of the same and a semiconductor package having the lead frame.
Figure 2:
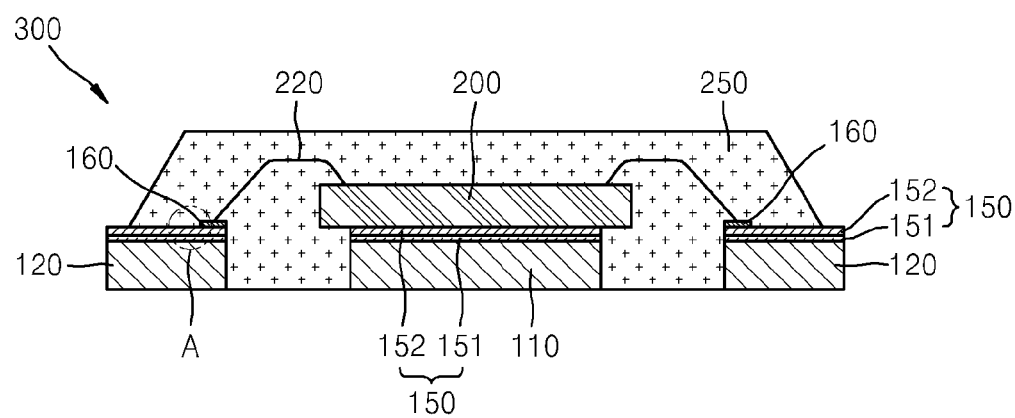
FIG. 2 is a sectional view of the same, obtained along a line II-II of FIG. 1, according to an exemplary embodiment.
Figure 3:
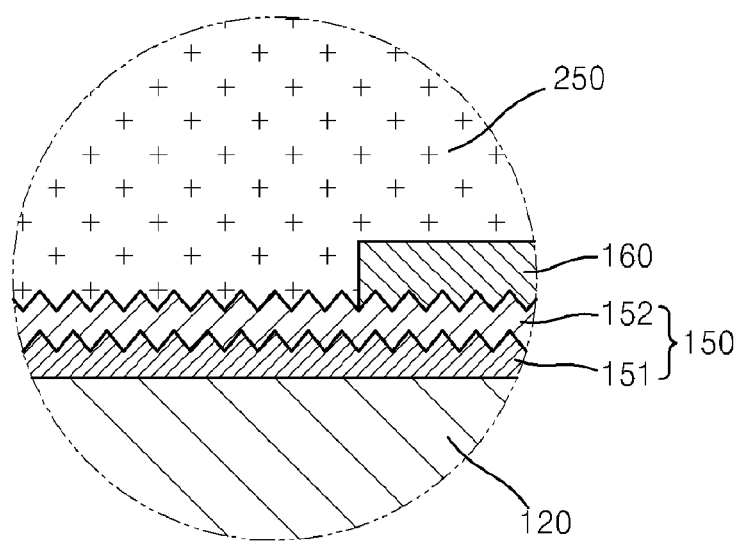
FIG. 3 is a diagram showing portion A of FIG. 2 in closer detail.

FIG. 1 is a plan view of a lead frame and a semiconductor package having the lead frame according to an exemplary embodiment, and FIG. 2 is a sectional view of the same, obtained along a line II-II of FIG. 1. FIG. 3 is a diagram showing portion A of FIG. 2 in closer detail.

A semiconductor package 300 shown in FIG. 1 is a quad flat non-leaded (QFN) type package. Referring to FIGS. 1 and 2, the semiconductor package 300 includes a lead frame 100 and a semiconductor chip 200 that is installed on the lead frame 100. Although not shown, the semiconductor chip 200 may be attached to a die pad 110 via an adhesive.

The lead frame 100 includes the die pad 110, to which the semiconductor chip 200 is attached, and lead portions 120. The lead portions 120 are evenly arranged along the outer perimeter of the semiconductor chip 200, and are connected to electrode pads of the semiconductor chip 200 via bonding wires 220 to provide a wiring for input/output signals. The bonding wires 220 are formed of a material containing gold (Au) and electrically connect the semiconductor chip 200 and the lead portions 120.

The lead portions 120 are supported by an outer frame 170 to be evenly apart from each other, and a supporting portion 180 that extends from corners of the outer frame 170 may support the die pad 100 to balance the die pad 100.

The semiconductor chip 200 is sealed by a molded portion 250. The molded portion 250 contains a resin, such as epoxy molding compound (EMC), and protects the semiconductor chip 200 from external shock and pollution. The rear surface of the semiconductor package 300 is exposed to the outside and may be electrically connected to a circuit board (not shown).

A plating layer 150 is formed on the die pad 110 and a surface of the lead portion 120. The plating layer 150 includes a rough copper (Cu) plating layer 151 and a protective plating layer 152.

The rough Cu plating layer 151 has an uneven surface having a predetermined average surface roughness. The uneven surface of the rough Cu plating layer 151 may be a top surface of the Cu plating layer 151 disposed opposite to a bottom surface thereof contacting the die pad 110 and the lead portions 120. The bottom surface of the Cu plating layer may contact the die pad 110 and the lead portions 120, and may not be an uneven surface like the top surface. The protective plating layer 152 is formed on the uneven surface of the rough Cu plating layer 151, and has an uneven surface corresponding to the uneven surface of the rough Cu plating layer 151. That is, a bottom surface of the protective plating layer 152 contacting the top surface of the Cu plating layer 151 is also an uneven surface. The top surface of the protective plating layer 152 opposite to the bottom surface thereof may also be an uneven surface.

The protective plating layer 152 helps the rough Cu plating layer 151 to be firmly attached to the die pad 110 and the lead portions 120, and prevents exfoliation of the surface of the rough Cu plating layer 151. Since the rough Cu plating layer 151, which plays a role as a seed plating layer, is formed through rapid growth at a high current, adhesiveness with respect to an object on which the rough Cu plating layer 151 is plated is deteriorated. In other words, adhesiveness between the rough Cu plating layer 151 and the die pad 110, and adhesiveness between the rough Cu plating layer 151 and the lead portions 120 are deteriorated. In the present exemplary embodiment, the protective plating layer 152 is formed on the rough Cu plating layer 151, and improves adhesiveness between the rough Cu plating layer 151 and the die pad 110, and adhesiveness between the rough Cu plating layer 151 and the lead portions 120. As a result, the rough Cu plating layer 151 is easily fixed and protected from external substances. Since the protective plating layer 152 not only enhances the adhesiveness of the Cu plating layer 151 but also has a roughness on its surface, a roughness may be stably formed on the surface of the lead portions 120 and die pad 110.

The protective plating layer 152 may have a thickness of between about 0.125 μm and about 1.0 μm.

If the thickness of the protective plating layer 152 is less than 0.125 μm, the rough Cu plating layer 151 cannot be easily attached. Therefore, the thickness of the protective plating layer 152 may be equal to or greater than 0.125 μm. Further, if the thickness of the protective plating layer 152 exceeds 1.0 μm, it becomes difficult for the surface of the protective plating layer 152 to have an average surface roughness corresponding to the uneven surface of the rough Cu plating layer 151. Therefore, the thickness of the protective plating layer 152 may be less than or equal to 1.0 μm.

The protective plating layer 152 may contain various metals. The protective plating layer 152 may contain Cu for the reasons stated below.

First, if the protective plating layer 152 contains Cu, a plating operation is easily performed by using the rough Cu plating layer 151 beneath the protective plating layer 152 as a seed layer. Furthermore, adhesiveness between the protective plating layer 152 and the rough Cu plating layer 151 is improved. Furthermore, since Cu grains grow by using the rough Cu plating layer 151 having an uneven surface as a seed layer and forms the protective plating layer 152, it is easy to form the uneven surface of the protective plating layer 152 to have a predetermined average surface roughness corresponding to the uneven surface of the rough Cu plating layer 151.

According to an exemplary embodiment, the protective plating layer 152 may be a stacked layer of a nickel (Ni) plating layer containing Ni or a Ni alloy, a palladium (Pd) plating layer containing Pd or a Pd alloy, and an Au plating layer containing Au or an Au alloy. In other words, the protective plating layer 152 may be formed as a pre-plated frame. As a result, the solderability of the protective plating layer 152 is improved, and thus, an additional operation, such as lead plating, may not be necessary in later operations. The protective plating layer 152 having a stacked layer structure reduces cracks which may induce soldering defects in a group of products, in which external leads need to be bent, such as small-outline integrated circuits (SOIC) and quad flat packages (QFP). Further, if the bonding wire 220 contains Cu, the adhesiveness between the protective plating layer 152 and the bonding wire 220 is also improved. If the protective plating layer 152 contains Au or Pd, the adhesiveness between the molded portion 250 and the protective plating layer 152 may be improved.

The rough Cu plating layer 151 has excellent ductility as compared to other metals, such as Ni, and thus the rough Cu plating layer 151 prevents cracks in the protective plating layer 152 to be formed in later operations. If the bonding wire 220 contains Cu, the adhesiveness between the protective plating layer 152 and the bonding wire 220 is also improved.

The rough Cu plating layer 151 has an uneven surface having a predetermined average surface roughness. In details, the average surface roughness of the rough Cu plating layer 151 may be from about 0.1 μm to about 0.5 μm.

If the average surface roughness of the rough Cu plating layer 151 is less than 0.1 μm, convex portions and concave portions of the surface become extremely small, and thus, convex portions and concave portions to be formed on the protective plating layer 152, which is to be formed above the rough Cu plating layer 151, also become extremely small. As a result, interlocking of the protective plating layer 152 with the molded portion 250 is weakened, and thus, adhesiveness between the protective plating layer 152 and the molded portion 250 decreases. Therefore, the average surface roughness of the rough Cu plating layer 151 may be equal to or greater than 0.1 μm.

If, however, the average surface roughness of the rough Cu plating layer 151 is greater than 0.5 μm, the surface of the rough Cu plating layer 151 becomes unstable, and thus, the rough Cu plating layer 151 may be partially peeled. Therefore, the average surface roughness of the rough Cu plating layer 151 may be equal to or less than 0.5 μm.

The rough Cu plating layer 151 has a predetermined uneven surface roughness. The protective plating layer 152 is formed on the uneven surface of the rough Cu plating layer 151, and thus, has an uneven surface corresponding to the uneven surface of the rough Cu plating layer 151. The average surface roughness of the protective plating layer 152 may also be determined at between about 0.1 μm and about 0.5 μm.

In the semiconductor package 300, the lead frame 100 and the molded portion 250 have different surface characteristics, and thus, adhesiveness therebetween is poor. Furthermore, if external moisture osmoses into the semiconductor package 300, as moisture adhering to ingredients of the molded portion 250 expands at a high temperature, delamination may occur between the molded portion 250 and the lead frame 100, According to the present inventive concept, the protective plating layer 152, which is a part of the plating layer 150 and has an uneven surface, contacts the molded portion 250, and thus separation of the molded portion 250 and the lead frame 100 is prevented due to interlocking characteristic which occurs as the molded portion 250 and the lead frame 100 contact each other via a larger area. Therefore, delamination may be easily reduced.

The semiconductor chip 200 and the lead portion 120 are connected via the bonding wire 220. Another plating layer 160 may be selectively formed on the protective plating layer 152 disposed above the lead portion 120 for stable bonding. The plating layer 160 may contain silver (Ag). According to an exemplary embodiment, the selective plating layer 160 may be an Au plating layer or a stacked layer of Ni, Pd, and Au (i.e., Ni/Pd/Au). Especially, a plating layer having the structure as described above may be formed on the protective plating layer 152 in the case where the protective plating layer 152 contains Cu. Here, the stacked layer of Ni/Pd/Au may be formed on the entire top surface of the protective plating layer 152, instead of being formed on selective portions of the protective plating layer 152. Here, the Au plating layer, which is formed on the top surface of the protective plating layer 152, may contain Ag or Pd for improved adhesiveness between the Au plating layer and the molded portion 250.

Although not shown, a tin (Sn) plating layer may be formed on a bottom surface of the semiconductor package 300, that is, on exposed surfaces of the die pad 110 and the lead portion 120. When the semiconductor package 300 is mounted on an external circuit board in a later operation, a Sn plating layer may form a sturdy conductive attachment with land patterns of the external circuit board.

Although the semiconductor package 300 described above is a QFN type semiconductor package in which the rear surface of the lead frame 100 is exposed, the present inventive concept is not limited thereto. In other words, the present inventive concept may also be applied to a semiconductor package in which the lead frame 100 is surrounded and sealed by the molded portion 250. In this case, the plating layer 150 may be formed on both surfaces of the lead frame 100.

FIGS. 4A through 4E are sectional views for explaining a method of manufacturing a lead frame according to an exemplary embodiment of the present inventive concept. Referring to FIGS. 4A through 4E, the method of manufacturing a lead frame will be described below.

Figure 4A:
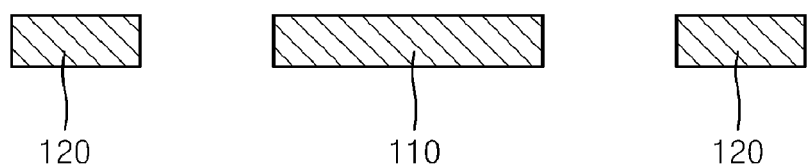
FIGS. 4A through 4E are sectional views for explaining a method of manufacturing a lead frame, according to an exemplary embodiment.

Referring to FIG. 4A, the die pad 110 and the lead portion 120 are formed by patterning a raw material substrate containing a metal. In detail, the die pad 110 and the lead portion 120 may be formed by patterning a raw material substrate containing a metal, such as Cu, a Cu alloy, or an alloy 42. Various patterning methods may be used, such as etching, stamping, and punching.

Figure 4B:
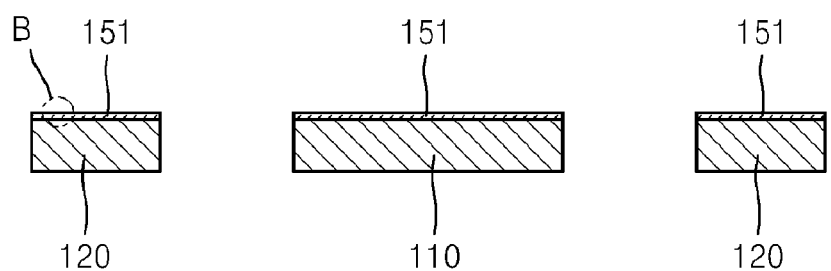
Figure 4C:
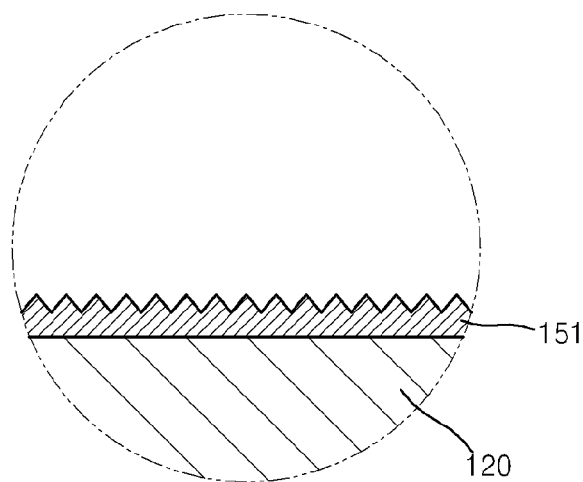

Then, referring to FIGS. 4B and 4C, the rough Cu plating layer 151 is formed. The rough Cu plating layer 151 is formed in Cu sulphate solution by using an electroplating method. A density of current during an electroplating operation may be equal to or greater than 15 A/dm$^2$, such that the surface of the rough Cu plating layer 151 may have a predetermined average surface roughness.

In detail, the Cu sulphate solution contains sulphuric acid and Cu sulphate 5 hydrate ($CuSO_4.5H_2O$). Concentrations of the sulphuric acid and the $CuSO_4.5H_2O$ may be determined as described below.

The concentration of the $CuSO_4.5H_2O$ may be from about 10 g/l to about 30 g/l. If the concentration of the $CuSO_4.5H_2O$ is lower than 10 g/l, Cu sulphate ions are not sufficient in the solution. As a result, it takes more time to perform the electroplating operation, and it is necessary to increase the density of current to form the rough Cu plating layer 151. In this case, the growth of the rough Cu plating layer 151 is unstable, and thus, adhesiveness between the rough Cu plating layer 151 and the die pad 110, and adhesiveness between the rough Cu plating layer 151 and the lead portion 120 decrease. Therefore, the concentration of the $CuSO_4.5H_2O$ may be equal to or higher than 10 g/l.

If the concentration of the $CuSO_4.5H_2O$ is higher than 30 g/l, the rough Cu plating layer 151 may grow excessively, and a smut may occur. Due to the smut, the rough Cu plating layer 151 may be separated from the die pad 110 and the lead portion 120 or the surface of the rough plating layer 151 may be partially peeled. Further, the rough Cu plating layer 151 may grow excessively from the lead portion 120, and thus, a burr may occur. Therefore, the concentration of the $CuSO_4.5H_2O$ may be lower than or equal to 30 g/l.

The concentration of the sulphuric acid may be determined at between about 20 ml/l and about 60 ml/l. If the concentration of the sulphuric acid is lower than 20 ml/l, conductive salts are not sufficient in the solution, and thus, the rough Cu plating layer 151 is formed with black portions that are burnt due to collection of currents. In this case, the rough Cu plating layer 151 cannot have a desired average surface roughness and exhibits reduced conductivity. Therefore, the concentration of the sulphuric acid may be equal to or higher than 20 ml/l.

If the concentration of the sulphuric acid is higher than 60 ml/l, conductive salts become excessive in the solution. As a result, a plating layer is polished. Therefore, it becomes difficult to form the rough Cu plating layer 151 including an uneven surface having a predetermined average surface roughness. Therefore, the concentration of the sulphuric acid may be lower than or equal to 60 ml/l.

If the rough Cu plating layer 151 is formed by using an electroplating method, the electroplating operation may be performed for a time between about 5 seconds and about 20 seconds. If the electroplating operation is performed for less than 5 seconds, the rough Cu plating layer 151 may not be attached to the die pad 110 and the lead portion 120. Therefore, the electroplating operation for forming the rough Cu plating layer 151 may be performed for 5 seconds or longer. Meanwhile, if the electroplating operation is performed for longer than 20 seconds, the surface of the rough Cu plating layer 151 may be peeled. Therefore, the electroplating operation for forming the rough Cu plating layer 151 may be performed for 20 seconds or shorter.

The rough Cu plating layer 151 has an uneven surface having a predetermined average surface roughness. In details, the average surface roughness of the rough Cu plating layer 151 may be from about 0.1 μm to about 0.5 μm.

If the average surface roughness of the rough Cu plating layer 151 is less than 0.1 μm, convex portions and concave portions of the surface become extremely small, and thus, convex portions and concave portions to be formed on the protective plating layer 152, which is to be formed above the rough Cu plating layer 151, also become extremely small. As a result, interlocking of the protective plating layer 152 with the molded portion 250 is weakened, and thus, adhesiveness between the protective plating layer 152 and the molded portion 250 decreases. Therefore, the average surface roughness of the rough Cu plating layer 151 may be 0.1 μm.

If, however, the average surface roughness of the rough Cu plating layer 151 is greater than 0.5 μm, the surface of the rough Cu plating layer 151 becomes unstable, and thus the rough Cu plating layer 151 may be partially peeled. Therefore, the average surface roughness of the rough Cu plating layer 151 may be equal to or less than 0.5 μm.

Figure 4D:
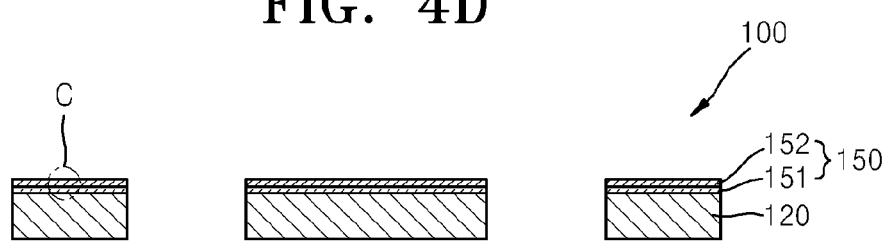
Figure 4E:
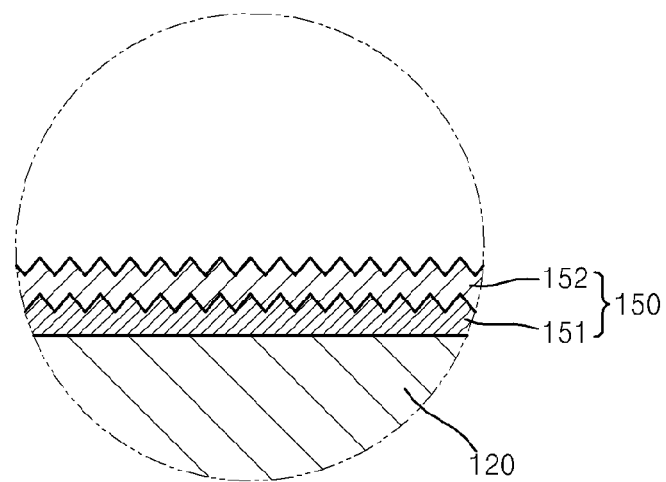

Referring to FIGS. 4D and 4E, the protective plating layer 152 is formed on the uneven surface of the rough Cu plating layer 151. Accordingly, the plating layer 150 including the rough Cu layer 151 and the protective plating layer 152 is formed, and thus, the lead frame 100 including the die pad 110, the lead portions 120 and the plating layer 150 is formed.

The rough Cu plating layer 151 has an uneven surface having a predetermined average surface roughness. The protective plating layer 152 is formed on the uneven surface of the rough Cu plating layer 151, and thus, has an uneven surface corresponding to the uneven surface of the rough Cu plating layer 151. The average surface roughness of the protective plating layer 152 may also be determined at between about 0.1 μm and about 0.5 μm.

The rough Cu plating layer 151 is formed through rapid growth at a high current, adhesiveness with respect to an object on which the rough Cu plating layer 151 is plated is deteriorated. In other words, adhesiveness between the rough Cu plating layer 151 and the die pad 110, and adhesiveness between the rough Cu plating layer 151 and the lead portions 120 are deteriorated. In the present exemplary embodiment, the protective plating layer 152 is formed on the rough Cu plating layer 151 and improves adhesiveness between the rough Cu plating layer 151 and the die pad 110, and adhesiveness between the rough Cu plating layer 151 and the lead portions 120. As a result, the rough Cu plating layer 151 is easily fixed and protected from external substances. The Cu plating layer may be formed of various metal elements. Since the protective layer 152 enhances the adhesiveness of the rough Cu plating layer 151 as it grows on the rough Cu plating layer 151, the surface of the plating layer 150 may be more flexible compared with that of a rough plating layer which is grown directly from the surface of a lead frame without a protective layer. Therefore, the plating layer 150 may enhance bonding strength in a wire bonding process.

The protective plating layer 152 may have a thickness of between about 0.125 μm and about 1.0 μm.

If the thickness of the protective plating layer 152 is less than 0.125 μm, the rough Cu plating layer 151 cannot be easily attached. Therefore, the thickness of the protective plating layer 152 may be equal to or greater than 0.125 μm. Furthermore, if the thickness of the protective plating layer 152 exceeds 1.0 μm, it becomes difficult for the surface of the protective plating layer 152 to have an average surface roughness corresponding to the uneven surface of the rough Cu plating layer 151. Therefore, the thickness of the protective plating layer 152 may be less than or equal to 1.0 μm.

The protective plating layer 152 may contain various metals. The protective plating layer 152 may contain Cu for reasons stated below.

First, if the protective plating layer 152 contains Cu, plating operation is easily performed by using the rough Cu plating layer 151 beneath the protective plating layer 152 as a seed layer. Furthermore, adhesiveness between the protective plating layer 152 and the rough Cu plating layer 151 is improved. Furthermore, since Cu grains grow by using the rough Cu plating layer 151 having an uneven surface as a seed layer and forms the protective plating layer 152, and thus it is easy and quick to form the uneven surface of the protective plating layer 152, having a predetermined average surface roughness corresponding to the uneven surface of the rough Cu plating layer 151. In other words, since the protective plating follows the rough seed plating which is performed quickly on the substantially entire surface of an object being plated, the rough plating layer may be formed more quickly and has more even surface roughness compared with prior arts.

According to an exemplary embodiment, the protective plating layer 152 may be a stacked layer of a Ni plating layer containing Ni or a Ni alloy, a Pd plating layer containing Pd or a Pd alloy, an Au plating layer containing Au or an Au alloy. Detailed description thereof is as described above. The lead frame 100 accordingly manufactured in the present exemplary embodiment may be applied to various semiconductor packages.

Figure 5A:
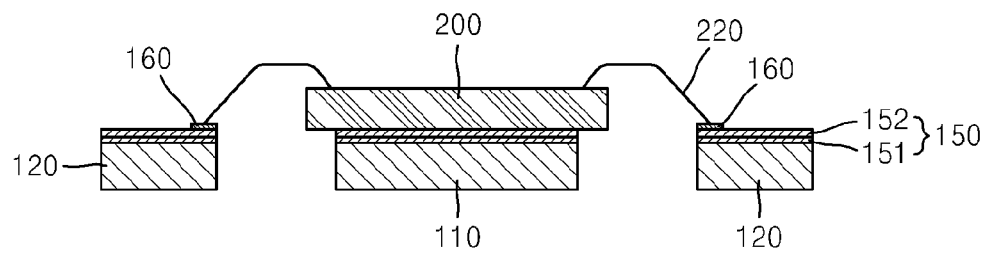
FIGS. 5A and 5B are sectional views for explaining a method of fabricating a semiconductor package by using a method of fabricating a lead frame according to an exemplary embodiment.
Figure 5B:
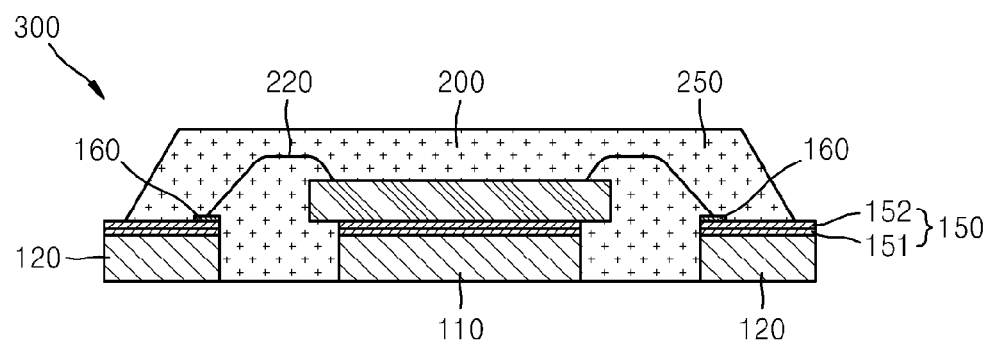

FIGS. 5A and 5B are sectional views for explaining a method of fabricating a semiconductor package by using a method of fabricating a lead frame according to an exemplary embodiment.

Since the method of fabricating a semiconductor package includes operations shown in FIGS. 4A through 4E, detailed descriptions thereof will be omitted, and operations thereafter will be described below.

Referring to FIG. 5A, the semiconductor chip 200 is mounted on the die pad 110. Although not shown, an adhesive layer may be interposed between the semiconductor chip 200 and the plating layer 150 for safely mounting the semiconductor chip 200.

The semiconductor chip 200 and the lead portion 120 are connected via the bonding wire 220. An Ag plating layer 160 may be selectively formed on the protective plating layer 152 disposed above the lead portion 120 for stable bonding. The Ag plating layer 160 contacts the bonding wire 220, and thus, the reliability of adherence between the bonding wire 220 and the lead portion 120 is improved. According to an exemplary embodiment, the plating layer 160 may be an Au plating layer or a stacked layer of Ni/Pd/Au. Especially, a plating layer having the structure as described above may be formed on the protective plating layer 152 in the case where the protective plating layer 152 contains Cu. Here, the stacked layer of Ni/Pd/Au may be formed on the entire top surface of the protective plating layer 152, instead of being formed on selective portions of the protective plating layer 152. Here, the Au plating layer may contain Ag or Pd. Detailed description thereof is as described above.

Next, referring to FIG. 5B, the semiconductor package 300 is fabricated by sealing the semiconductor chip 200 by using the molded portion 250. In detail, the lead frame 100 on which the semiconductor chip 200 is mounted is set inside a mold for molding resin, a resin, such as epoxy molding compound (EMC), is injected into the mold, and the resin is hardened at a high temperature. Accordingly, the molded portion 250 is formed. The semiconductor package 300, in which the semiconductor chip 200 and the lead frame 100 are integrated with each other, as shown in FIG. 5B is formed as the entire upper portion of the lead frame 100 except the rear surface of the lead frame 100 is covered by the resin.

The molded portion 250 contacts the protective plating layer 152. The protective plating layer 152 has an uneven surface corresponding to the uneven surface of the rough Cu plating layer 151. Therefore, an interlocking characteristic which occurs as the molded portion 250 and the protective plating layer 152 contact each other via a larger area is improved, and the adhesiveness between the molded portion 250 and the protective plating layer 152 increases. As a result, the molded portion 250 provides improved sealing, and thus, the durability of the semiconductor package 300 is improved.

Although not shown, a Sn plating layer may be formed on the bottom surface of the die pad 110 and the lead portion 120 that are exposed to the outside. During such Sn plating operation, either Sn or a Sn alloy is plated on the bottom surfaces of the die pad 110 and the lead portion 120 by using a general electroplating method.

Meanwhile, although the exemplary embodiments are described above based on a QFN package and a lead frame structure applied thereto, it is clear that the technical principles of the present inventive concept may be applied to various other lead frame structures.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:
1. A lead frame comprising:
at least one lead portion arranged to be connected to at least one semiconductor chip; and
at least one plating layer formed on at least one of the at least one lead portion,
wherein a top surface of the at least one plating layer comprises an uneven portion having a first average surface roughness, and the plating layer comprises a copper (Cu) plating layer containing copper and a protective plating layer formed on the Cu plating layer, and
wherein the first average surface roughness of the at least one plating layer is between about 0.1 μm and about 0.5 μm.

2. The lead frame of claim 1, further comprising a die pad on which the at least one semiconductor chip is to be disposed.

3. The lead frame of claim 1, wherein the at least one plating layer is formed on the at least one lead portion,
wherein, to constitute a semiconductor package, the uneven portion of the top surface of the at least one plating layer is configured to contact a molded portion which seals the lead frame and the at least one semiconductor chip, and
wherein the uneven portion is configured to provide a larger surface area to the at least one plating layer than a situation in which the top surface of the at least one plating layer does not comprise an uneven portion.

4. The lead frame of claim 1, further comprising another plating layer selected from the group consisting of a silver (Ag) plating layer, a gold (Au) plating layer, and a plating layer having a stacked structure of nickel (Ni)/palladium (Pd)/gold (Au), disposed on the protective plating layer.

5. The lead frame of claim 1, wherein the protective plating layer contains Cu.

6. The lead frame of claim 1, wherein the protective plating layer comprises at least one of:
a nickel (Ni) plating layer containing Ni or a Ni alloy;
a palladium (Pd) plating layer which is formed on the Ni plating layer and contains Pd or a Pd alloy; and
a gold (Au) plating layer which is formed on the Pd plating layer and contains Au or an Au alloy.

7. A lead frame comprising:
at least one lead portion arranged to be connected to at least one semiconductor chip; and
at least one plating layer formed on at least one of the at least one lead portion,
wherein a top surface of the at least one plating layer comprises an uneven portion having a first average surface roughness, and the plating layer comprises a copper (Cu) plating layer containing copper and a protective plating layer formed on the Cu plating layer,
wherein the top surface of the at least one plating layer is a top surface of the protective plating layer, and
wherein a thickness of the protective plating layer is greater than that of the Cu plating layer.

8. The lead frame of claim 1, wherein a thickness of the protective plating layer is between about 0.125 μm and about 1.0 μm.

9. The lead frame of claim 1, wherein the protective plating layer comprises a stacked layer of nickel (Ni)/palladium (Pd)/gold (Au).

10. The lead frame of claim 1, wherein a top surface of the Cu plating layer comprises an uneven portion having a second average surface roughness.

11. The lead frame of claim 10, wherein a bottom surface of the protective plating layer, contacting the top surface of the Cu plating layer, comprises an uneven portion corresponding to the uneven portion of the Cu plating layer, and
wherein the uneven portion of the bottom surface of the protective plating layer has the second average surface roughness.

12. The lead frame of claim 11, wherein the first average surface roughness is substantially the same as the second average surface roughness, and determined at between about 0.1 μm and about 0.5 μm.

13. A method of manufacturing a lead frame, the method comprising:
    forming at least one lead portion by patterning a raw material substrate; and
    forming at least one plating layer on at least one of the at least one lead portion so that a top surface of the at least one plating layer comprises an uneven portion having a first average surface roughness,
    wherein the forming the at least one plating layer comprises:
        forming a copper (Cu) plating layer containing copper on the at least one of the at least one lead portion; and
        forming a protective plating layer on the Cu plating layer, wherein the top surface of the at least one plating layer is a top surface of the protective plating layer, and
    wherein the first average surface roughness of the at least one plating layer is between about 0.1 μm and about 0.5 μm.

14. The method of claim 13, wherein forming at least one lead portion comprises forming a die pad on which the at least one semiconductor chip is to be disposed.

15. The method of claim 13, wherein the protective plating layer comprises at least one of:
    a nickel (Ni) plating layer containing Ni or a Ni alloy;
    a palladium (Pd) plating layer which is formed on the Ni plating layer and contains Pd or a Pd alloy; and
    a gold (Au) plating layer which is formed on the Pd plating layer and contains Au or an Au alloy.

16. The method of claim 13, wherein a thickness of the protective plating layer is greater than a thickness of the Cu plating layer.

17. The method of claim 13, wherein a thickness of the protective plating layer is between about 0.125 μm and about 1.0 μm.

18. The method of claim 13, further comprising forming another plating layer selected from a group of a silver (Ag) plating layer, a gold (Au) plating layer, and a plating layer having a stacked structure of nickel (Ni)/palladium (Pd)/gold (Au), disposed on the protective plating layer.

19. The method of claim 13, wherein the protective plate layer comprises a stacked layer of nickel (Ni)/palladium (Pd)/gold (Au).

20. The method of claim 13, wherein the forming the Cu plating layer is performed such that a top surface of the Cu plating layer comprises an uneven portion having a second average surface roughness.

21. The method of claim 20, wherein the forming the protective plating layer is performed such that a bottom surface of the protective plating layer, contacting the top surface of the Cu plating layer, comprises an uneven portion corresponding to the uneven portion of the Cu plating layer, and
    wherein the uneven portion of the bottom surface of the protective plating layer has the second average surface roughness.

22. The method of claim 13, wherein the Cu plating layer is formed in copper sulphate solution by using an electroplating operation.

23. The method of claim 22, wherein the copper sulphate solution contains sulphuric acid and copper sulphate 5 hydrate ($CuSO_4 \cdot 5H_2O$).

24. The method of claim 22, wherein a concentration of the sulphuric acid in the copper sulphate solution is between about 20 ml/l and about 60 ml/l.

25. The method of claim 22, wherein a concentration of the $CuSO_4 \cdot 5H_2O$ in the copper sulphate solution is between about 10 g/l and about 30 g/l.

26. The method of claim 22, wherein the Cu plating layer is formed by applying electric current for between about 5 seconds and about 20 seconds.

* * * * *